US010769867B2

(12) United States Patent
Mustonen et al.

(10) Patent No.: US 10,769,867 B2
(45) Date of Patent: Sep. 8, 2020

(54) METHOD FOR MAINTENANCE OF A TRANSPORTATION DEVICE, SOFTWARE PROGRAM, AND CONTROLLER

(71) Applicant: Kone Corporation, Helsinki (FI)

(72) Inventors: Matti Mustonen, Helsinki (FI); Jyrki Laaksonheimo, Helsinki (FI)

(73) Assignee: Kone Corporation, Helsinki (FI)

( * ) Notice: Subject to any disclaimer, the term of this patent is extended or adjusted under 35 U.S.C. 154(b) by 0 days.

(21) Appl. No.: 16/199,359

(22) Filed: Nov. 26, 2018

(65) Prior Publication Data

US 2019/0197796 A1 Jun. 27, 2019

(30) Foreign Application Priority Data

Dec. 22, 2017 (EP) .................................... 17210239

(51) Int. Cl.
*G07C 5/00* (2006.01)
*B66B 5/00* (2006.01)
(Continued)

(52) U.S. Cl.
CPC ............ *G07C 5/006* (2013.01); *B66B 5/0025* (2013.01); *G01R 31/007* (2013.01); *G07C 5/085* (2013.01);
(Continued)

(58) Field of Classification Search
CPC ...... G07C 5/006; G07C 5/0808; G07C 5/085; G07C 3/00; H02P 6/34; H02P 6/007;
(Continued)

(56) References Cited

U.S. PATENT DOCUMENTS

2009/0164170 A1* 6/2009 Larsen ............... G01D 5/24461
702/151
2011/0108369 A1* 5/2011 Stolt ........................ B66B 1/30
187/391
2011/0173496 A1* 7/2011 Hosek ................ G05B 23/0235
714/26

FOREIGN PATENT DOCUMENTS

| EP | 1010660 A1 | 6/2000 |
| EP | 2073372 A1 | 6/2009 |
| WO | WO-2009/144362 A1 | 12/2009 |

OTHER PUBLICATIONS

European Search Report for EP17210239 dated Jul. 24, 2018.

* cited by examiner

*Primary Examiner* — Anne Marie Antonucci
*Assistant Examiner* — Andrew J Cromer
(74) *Attorney, Agent, or Firm* — Harness, Dickey & Pierce, P.L.C.

(57) ABSTRACT

Maintenance of a transportation device propelled by an electric motor, wherein an incremental encoder senses motion of a moving part of, or a part moved by, the electric motor, may include acquiring a pulses-per-rotation configuration value PPRconf, representing a quantity of pulses which should be provided by the incremental encoder per one rotation of the electric motor; deriving a pulses-per-rotation estimation value PPRest representing a quantity of pulses provided by the incremental encoder per one rotation of the electric motor; determining a pulses-per-rotation error value PPRerr representing a deviation of the pulses-per-rotation estimation value PPRest from the pulses-per-rotation configuration value PPRconf, based on a relation: PPRerr=PPRest−PPRconf, PPRconf−PPRest, PPRest/PPRconf, or PPRconf/PPRest; and utilizing the pulses-per-rotation error value PPRerr to generate an instance of
(Continued)

maintenance information indicating that a maintenance operation should be performed on the transportation device.

20 Claims, 2 Drawing Sheets (51) Int. Cl.
*H02P 6/34* (2016.01)
*G01R 31/00* (2006.01)
*G07C 5/08* (2006.01)
*H02P 6/00* (2016.01)
*H02P 6/16* (2016.01)

(52) U.S. Cl.
CPC ............ *G07C 5/0808* (2013.01); *H02P 6/007* (2013.01); *H02P 6/16* (2013.01); *H02P 6/34* (2016.02)

(58) Field of Classification Search
CPC ........ H02P 6/16; H02P 2101/15; H02P 6/185; H02P 2203/01; B66B 5/0025; B66B 1/30; G01R 31/007; G01D 5/24461; H03M 1/0656; H03M 1/24; G05B 23/0235; G06F 11/008
See application file for complete search history.

METHOD FOR MAINTENANCE OF A TRANSPORTATION DEVICE, SOFTWARE PROGRAM, AND CONTROLLER

CROSS-REFERENCE TO RELATED APPLICATION

This application claims priority to European Patent Application No. EP17210239.4 filed on Dec. 22, 2017, the entire contents of which are incorporated herein by reference.

BACKGROUND

The present invention relates to a method for maintenance of a transportation device, a software program, and a controller.

There are many kinds of transportation devices using an electric motor for propelling, e.g. elevators, escalators, speedways, cable cars, railways, etc. The background of the invention will be described for an elevator, but may be applied to other transportation devices as well. In an elevator, the accurate elevator position is needed to fulfill functionality and performance requirements of the elevator. Typically there is an incremental encoder attached either directly to the shaft or to the surface via wheel of an electrical motor moving the elevator car. Rotor angular speed and elevator position is calculated from the encoder pulses based on received pulses and information about encoder properties. One such encoder property is a parameter called Pulses Per Revolution (PPR), which defines how many encoder pulses are received during one revolution of the rotor. There are many fault modes related to this measurement including but not limited to:

- Electrical disturbances deteriorate pulse waveforms and lead to missing/additional pulse,
- Wrong configuration (e.g. wrong pulse number like 8000 PPR instead of correct 8192 PPR),
- Slipping wheel at the rotor surface due to too little friction or worn/damaged wheel material.

These failures may lead to wrong speed measurement and elevator position, leading to problems in the elevator system. When the failure effects are severe, some control system may detect them already and creates an error code. However, it is difficult to identify a possible failure at an early stage where effects are not such severe.

When controlling a Permanent Magnet Synchronous Motor (PMSM) with closed loop control, it is essential to get proper rotor orientation. It is known that the control may provide a good estimate about electrical supply frequency of the motor and thus the orientation.

SUMMARY

An object of the present invention is to provide a method, a software, and a controller capable of providing a predictive parameter for predicting a potential failure caused by erroneous incremental encoder output. The object is solved by the features of the independent claims. Further developments and advantageous embodiments are covered by the dependent claims.

The inventors started out from the consideration that it might be advantageous to provide a predictive parameter that gives early indication about an emerging problem caused by erroneous incremental encoder output. The inventors also recognized that independent speed and position estimates could be derived from estimated electrical supply frequency of the motor and orientation of the closed loop motor control as mentioned above, and this information could be converted to encoder pulse estimation. The predictive parameter in the PPR measurement could therefore be a deviation of the estimated encoder pulse number from a nominal/configured value thereof. This way, a signal needed to predict emerging failures can be provided.

Therefore, an aspect of the invention is a method for maintenance of a transportation device propelled by an electric motor, wherein an incremental encoder senses motion of a moving part of or a part moved by said electric motor, wherein a motor model is used in control of said electric motor, wherein said method comprises:

acquiring a pulses-per-rotation configuration value PPRconf, representing a number of pulses which should be provided by the incremental encoder per one rotation of the electric motor in normal operation;

deriving a pulses-per-rotation estimation value PPRest representing a number of pulses per one rotation of the electric motor, based on motor model information of the electrical motor control;

determining a pulses-per-rotation error value PPRerr representing a deviation of the pulses-per-rotation estimation value PPRest from the pulses-per-rotation configuration value PPRconf, based on the relation:

$$PPRerr=PPRest-PPRconf \text{ or } PPRconf-PPRest \text{ or } PPRest/PPRconf \text{ or } PPRconf/PPRest;$$

and utilizing the pulses-per-rotation error value PPRerr for establishing a maintenance information indicating that a maintenance should be done on the transportation device.

The pulses-per-rotation configuration value PPRconf which is a drive parameter by design defines how many pulses an encoder, when installed to the transportation device (e.g. elevator) and operating correctly, should give when a rotor/traction sheave rotates one revolution. This drive parameter may also be referred to as "EncoderPPR". So PPRconf defines what pulses-per-rotation number should be if the encoder model is right and operating correctly. In this connection, it should be noted that the encoder may be installed to a motor shaft, or it may be coupled to a traction sheave surface with a smaller encoder wheel, such that much more encoder pulses are received per one traction sheave revolution. Based on the above, in the aforementioned method, the pulses-per-rotation configuration value PPRconf may be acquired based on the relation:

$$PPRconf = r \times PPRenc,$$

wherein PPRenc is a number of pulses per one rotation of a measuring wheel axis of the incremental encoder, and r is a nominal transmission ratio (gear ratio?) between the measuring wheel axis of the incremental encoder and a drive axis of the electric motor.

To get the pulses-per-rotation estimation value PPRest, motor model information of the electrical motor control is utilized. A way to estimate pulses-per-rotation number from motor model information is shown, e.g., in WO 2009/144362 A1 in formulae (3) and (4), FIGS. 3 and 4, and respective description, disclosure of which is enclosed herein by way of reference in this regard. However, the invention is not limited to the way described in WO 2009/144362 A1. The pulses-per-rotation estimation value PPRest is used in combination with an encoder measurement signal. This way the real (estimated) pulse count per traction sheave revolution may be known. To know when a full traction sheave revolution is traveled, can be estimated based on the simulation model, according to WO 2009/144362 A1 as mentioned above, by way of non-exclusive example. Then, the pulses-per-rotation error value PPRerr is a deviation between a real estimated pulse count per revolution and what should be according to the drive parameter "Encoder-PPR". Based on the above, in the aforementioned method, the deriving a pulses-per-rotation estimation value PPRest may comprise the steps:

measuring a stator current of a stator winding of said electric motor;
  estimating a stator voltage of a stator winding of said electric motor, based on said motor model;
  estimating a magnetic pole position of the magnetic pole of the rotor of said electric motor, based on said measured stator current and determined stator voltage;
  counting output pulses of the incremental encoder, to obtain an encoder pulse count;
  determining a position error of a rotor of said electric motor, based on said estimated magnetic pole position and counted encoder pulses;
  correcting said counted encoder pulses by means of said determined position error, to obtain a corrected encoder pulse count; and
  comparing said corrected encoder pulse count with the pulses-per-rotation configuration value PPRconf.

In the aforementioned method, the acquiring and deriving and determining steps may be executed after completion of a travelling event of the transportation device.

In the aforementioned method, the establishing a maintenance information may comprise:

collecting the pulses-per-rotation error value PPRerr after a certain number of determinations on a regular basis or on a sample basis or on a random basis, preferably every time it is determined;
  computing error statistics over a predetermined time interval based on the collected error values, where the predetermined time interval preferably is a day;
  evaluating trend information based on the computed error statistics over a plurality of said predetermined time intervals; and
  if the evaluated trend information meets a predetermined maintenance criterion, establishing said maintenance information.

The electric motor may be a synchronous machine and may be connected to a frequency converter including a load bridge driven based on a motor model. The motor control may include a vector control. The stator voltage may be estimated based on a switching reference of solid state switches of the load bridge.

In the aforementioned method, the predetermined maintenance criterion may be chosen such that the maintenance information is established before a failure or problem arises.

In the aforementioned method, the predetermined maintenance criterion may be chosen in view of a certain kind of failure or problem, and the maintenance information established on the basis of the predetermined maintenance criterion is indicative of the certain kind of failure or problem.

In the aforementioned method, the evaluating and establishing steps may be executed at a remote monitoring unit or data analysis platform which preferably is located in a cloud computing system.

In the aforementioned method, the collecting and computing steps may be executed at a local control unit of the transportation device.

In the aforementioned method, the established maintenance information may be transferred or made accessible to a remote maintenance center or a mobile service unit or a local control unit of the elevator system, depending on a kind of failure or problem indicated by the maintenance information. I.e., said maintenance information may be a control signal to the local control unit, or a service needs report (message) to the remote maintenance center or directly to a serviceman.

In the aforementioned method, the electric motor may be a permanent magnet synchronous motor. The electric motor may have a plurality of phases, preferably three phases or a multiplicity of three phases. Furthermore, the electric motor may be controlled by a frequency converter. The motor control may provide two-component reference values for stator voltages and/or stator currents of said electric motor, for driving a load bridge of the frequency converter.

In the aforementioned method, the transportation device may be selected from one of an elevator, an escalator, a moving walkway, a cable car, a railway locomotive, a railcar, a roller coaster, a conveyor, a crane, a positioning unit, and combined systems of a plurality of single units of the same.

Another aspect of the invention is a software program realizing the method described above when executed on a computer. In the aforementioned software program, the computer may be a distributed computing system part of which being located in a/the cloud computing system. The software program may be embodied as a computer program product or a data carrier carrying data representing the software program.

Another aspect of the invention is a controller for controlling a transportation device propelled by an electric motor, wherein said controller comprises means for receiving an output of an incremental encoder which senses motion of a moving part of or a part moved by said electric motor;
  means for calculating a motor model for control of said electric motor;
  means for acquiring a pulses-per-rotation configuration value PPRconf representing a number of pulses which should be provided by the incremental encoder per one rotation of the electric motor in normal operation;
  means for deriving a pulses-per-rotation estimation value PPRest representing a number of pulses per one rotation of the electric motor, based on motor model information of the electrical motor control;
  means for determining a pulses-per-rotation error value PPRerr representing a deviation of the pulses-per-rotation estimation value PPRest from the pulses-per-rotation configuration value PPRconf, based on the relation:

PPRerr=PPRest−PPRconf or PPRconf−PPRest or
    PPRest/PPRconf or PPRconf/PPRest;

and
  means for establishing a maintenance information indicating that a maintenance should be done on the transportation device, utilizing the pulses-per-rotation error value PPRerr.

BRIEF DESCRIPTION OF DRAWINGS

Other aspects, features and advantages of the invention will become apparent by the below description of exemplary embodiments alone or in cooperation with the appended drawings.

DETAILED DESCRIPTION

Now, exemplary embodiments of the invention will be described in further detail.

Figure 1:
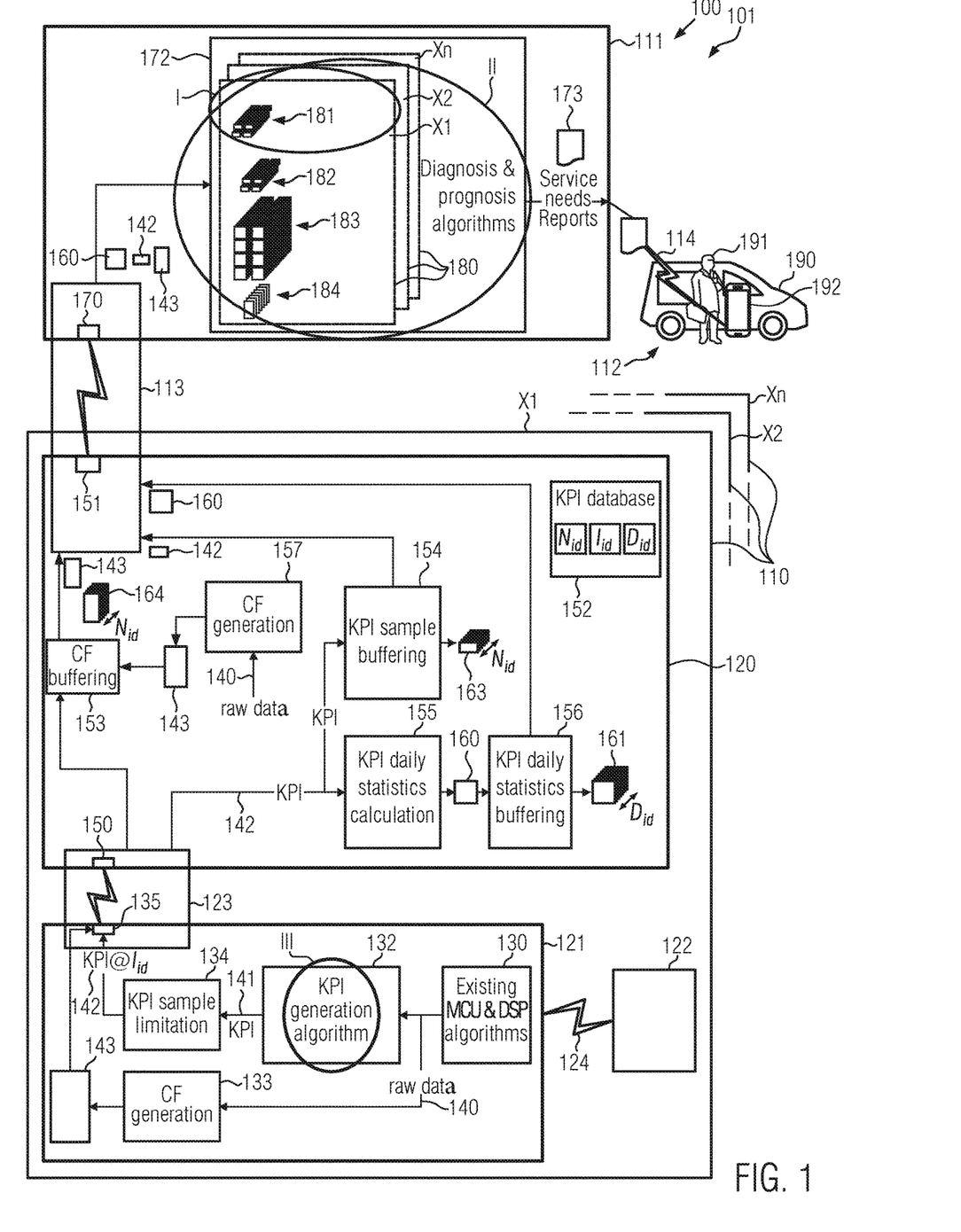
FIG. 1 is a schematic diagram of a maintenance system or method according to an exemplary embodiment of the invention.

FIG. 1 is a schematic diagram of a maintenance system 100 or method 101 according to an exemplary embodiment of the invention. It will be noted that elements shown in FIG. 1 may be realized as physical instances of the maintenance system 100, or steps of the maintenance method 101, or both.

The system 100 or method 101 is for maintenance of an elevator 110. There may be only one elevator in the system, but there may also be a multiplicity of elevators 110. For distinguishing elevators 110 from each other, each elevator 110 is designated a unique number, herein exemplified as X1, X2, . . . , Xn. In other words, there are n elevators 110 in the system, with n being 1, 2, or more.

A remote monitoring unit 111 is for monitoring each elevator 110 through diagnosis and prognosis algorithms which will be described later, and is in contact with a service unit 112. Even if only one service unit 112 is shown, more than one service unit 112 may be present. A device link 113 is for communication between the remote monitoring unit 111 and the elevator(s) 110, and a service link 114 is for communication between the remote monitoring unit 111 and the service unit(s) 112.

Each elevator 110 comprises a local control unit 120, a drive control board 121, and a motor drive 122 controlled by the drive control board 121, for moving an elevator car or cabin (not shown). A control link 123 is for communication between the local control unit 120 and the drive control board 121, and a drive link 124 is for connecting the drive control board 121 with the motor drive 122. The motor drive 122 may e.g. be a frequency converter converting three-phase mains voltage/current into three-phase motor voltage/current of a hoisting motor of the elevator 110, under control of the drive control board 121. Even if only one drive control board 121 and one motor drive 122 are shown, an elevator may have more than one cars, and a car may have one or more hoisting motors. So each car may be assigned one or more motor drives 122, and each motor drive 122 is assigned to one drive control board 121. However, one drive control board 121 may be responsible for one or more motor drives 122 of one or more elevator cars.

In this exemplary embodiment, the service link 114 is based on a mobile communications protocol, the device link 113 is based on SAG, wherein any other wireless or wired communication protocol is possible, the control link 123 is based on LON or device protocol, and the drive link 124 is based on a KDSC, wherein any serial communication protocol is possible. It will be thus noted that any other useful protocol may be used as needed.

The drive control board 121 includes a drive control 130 for executing MCU and DSP algorithms which per se are known in the art, for driving switches of the motor drive 122, a KPI generation 132, a CF generation 133, a KPI sample limitation 134, and an uplink interface 135 of the control link 123.

There are many signals calculated in the motion control and torque control algorithms located in the drive control 130. The drive control 130 therefore does see and handle many control values as it is controlling the motion of the hoisting machine and these signals can be used to evaluate condition of many system components. Many of these values are calculated either in real-time or after each travel and thus there would be lots of data generated if the values should be transferred to a remote server for analysis and maintenance purposes. A diagnostics framework has been developed to reduce data sent to a server and this framework shall be extended to a drive software as well. This specification describes what data is generated in a box marked with circles I, II, III for condition-based maintenance (CBM) purposes.

The signals calculated, detected or generated in the drive control 130 are passed, as a plurality of raw data 140, to the KPI generation 132 and CF generation 133. The KPI generation 132 has algorithms which generate so-called "Key Performance Indicators" (KPI) 141 from the raw data 140, and the CF generation 133 has algorithms which generate so-called "Condition files" (CF) 143 from the raw data 140. A KPI 141 may have the following structure:

<KPI sample 141>
1) timestamp
2) sample

A condition file 143 may have the following structure:

<Condition file (CF) 143>
header (timestamp, source)
data1, data2
2.123,134.345
2.278,127.780

It will be noted that numerical values in the condition file 143 above have no particular meaning in the context of the present invention and are purely by example. The condition file 143 may in general be referred to as a condition information, and the KPI sample 141/142 may in general be referred to as a performance information. Here, both KPIs and CFs can be used as condition and performance signals.

The condition files 143 are directly passed to the uplink interface 135 to be communicated to the local control unit 120, such as an elevator control unit. The KPIs 141 are passed to the KPI sample limitation 134 to generate a limited or selected KPI sample collection (KPI@$I_{id}$) 142 of the individual drive control board 121. The selected KPI samples 142 are then passed to the uplink interface 135 to be communicated to the local control unit 120.

The local control unit 120 has a downlink interface 150 of the control link 123, an uplink interface 151 of the device link 113, a KPI database 152, a CF buffering 153, a KPI sample buffering 154, a KPI daily statistics calculation 155, a KPI daily statistics buffering 156, and a CF generation 157. The local control unit 120 can produce KPIs also ("KPI generation algorithm").

The downlink interface 150 is for exchanging data with the drive control board 121, via the control link 123. The uplink interface 151 is for exchanging data with the remote monitoring unit 111, via the device link 113.

The KPI database 152 is for storing individual KPI samples 141 or KPI samples 142. The KPI database 152 may include a data structure including structured data relating to KPI samples and/or statistics, a memory area provided at the local control unit 120 for storing such data structure, and/or a process performing a database management method for managing such data structure.

The CF buffering 153 is for buffering condition files 143 passed from the drive control board 121 and other condition files 143 generated at the local control unit 120 itself, in a condition file stack 164, and passing the same to the uplink interface 151.

The KPI sample buffering 154 is for buffering selected KPI samples 142 passed from the drive control board 121 in a KPI sample stack 163, and passing the same to the uplink interface 151.

The KPI daily statistics calculation 155 is for calculating daily statistics files 160 from the KPI samples 142 passed from the drive control board 121, and passing the same to the KPI daily statistics buffering 156. A KPI daily statistics file 160 may have the following structure:

<KPI daily statistics file>
1) timestamp
2) minimum
3) maximum
4) average
5) standard deviation
6) amount of samples The KPI daily statistics buffering 156 is for buffering KPI daily statistics files 160 calculated in the KPI daily statistics calculation 155, in a KPI daily statistics stack 161 and passing the same to the uplink interface 151. The KPI daily statistics files 160 may in general be referred to as statistics information. It will be noted that also CF daily statistics files (not shown) may contribute to statistics information.

The CF generation 157 is for generating further condition files 143 from raw data 140 handled within local control unit 120. The generated condition files 143 are also passed to CF buffering 153 to be processed as described above.

The remote monitoring unit 111 has a downlink interface 170 of the device link 113, a diagnosis and prognosis 172, and an interface (not shown) of the service link 114. The diagnosis and prognosis 172 receives selected KPI samples 142, condition files 143 and KPI daily statistics files 160 from the downlink interface 170, to be provided at device images 180 which are provided for each single elevator 110 identified by each one's respective unique number X1, X2, . . . , Xn. The selected KPI samples 142 are gathered at the KPI daily statistics stack 161 and/or at the KPI sample stack 163. The latest KPI samples 142 can be fetched without being stacked. Each device image 180 includes an events and statistics history 181, a KPI history 182, a KPI statistics history 183, and a raw data history 184. It is seen that also raw data 140 may be passed via the links 123, 113 to the remote monitoring unit 111, even if not shown in the drawing. The diagnosis and prognosis section 172 has diagnosis and prognosis algorithms which apply diagnosis and prognosis processes to each device image's 180 data for generating a service needs report 173 relating to an elevator 110 if the diagnosis and prognosis processes conclude that a service is needed at the respective elevator 110. The service needs report 173 is then passed to the mobile service unit 112 via service link 114. Also, service visits at elevator sites (maintenance modules) may be scheduled and work tasks to be performed during the service visits may be selected at least partly based on diagnosis and prognosis processes. [MM1]

The service unit 112 may comprise a service car 190 operated by a serviceman 191, and comprises a communication device 192 such as a cellphone, car phone, smartphone, tablet, or the like. The service link 114 is established between the remote monitoring unit 111 and the communication device 192 of the service unit. If the service needs report 173 is received at the communication device 192, an alert is given so that the serviceman 191 will take notice, read the service needs report 173, and execute the service need at the elevator 110 the service needs report 173 directs to.

It will be noted that any measured/determined parameters related to drive control of a motor drive 122 of a hoisting motor (not shown) of the elevator 110 may be raw data 140, and a wide variety of parameters may be derived therefrom as key performance indicator (KPI) sample 141/142 or condition file 143. Accordingly, any KPI samples 141/142 and any condition file 143 may be further processed as described above. In other words, daily statistics 160 may be generated, history data 181-184 may be collected to provide an image of each elevator 110 in the system, and diagnosis and prognosis algorithms may be applied, to generate a service need report 173 if a problem is predicted to likely occur soon.

It will be noted that no additional hardware is needed for these estimations but the condition files 143 and/or KPI samples 141/142 can be determined (estimated) using existing hardware. Already with existing software, several drive signals may be derived which may be useful as raw data 140. The determined value(s) can be delivered to a data center (remote monitoring unit 111) and used in a Condition Based (aka predictive) Maintenance (CBM) to optimize replacement and maintenance intervals so that full lifetime is used and no functional failures shall occur.

Figure 2:
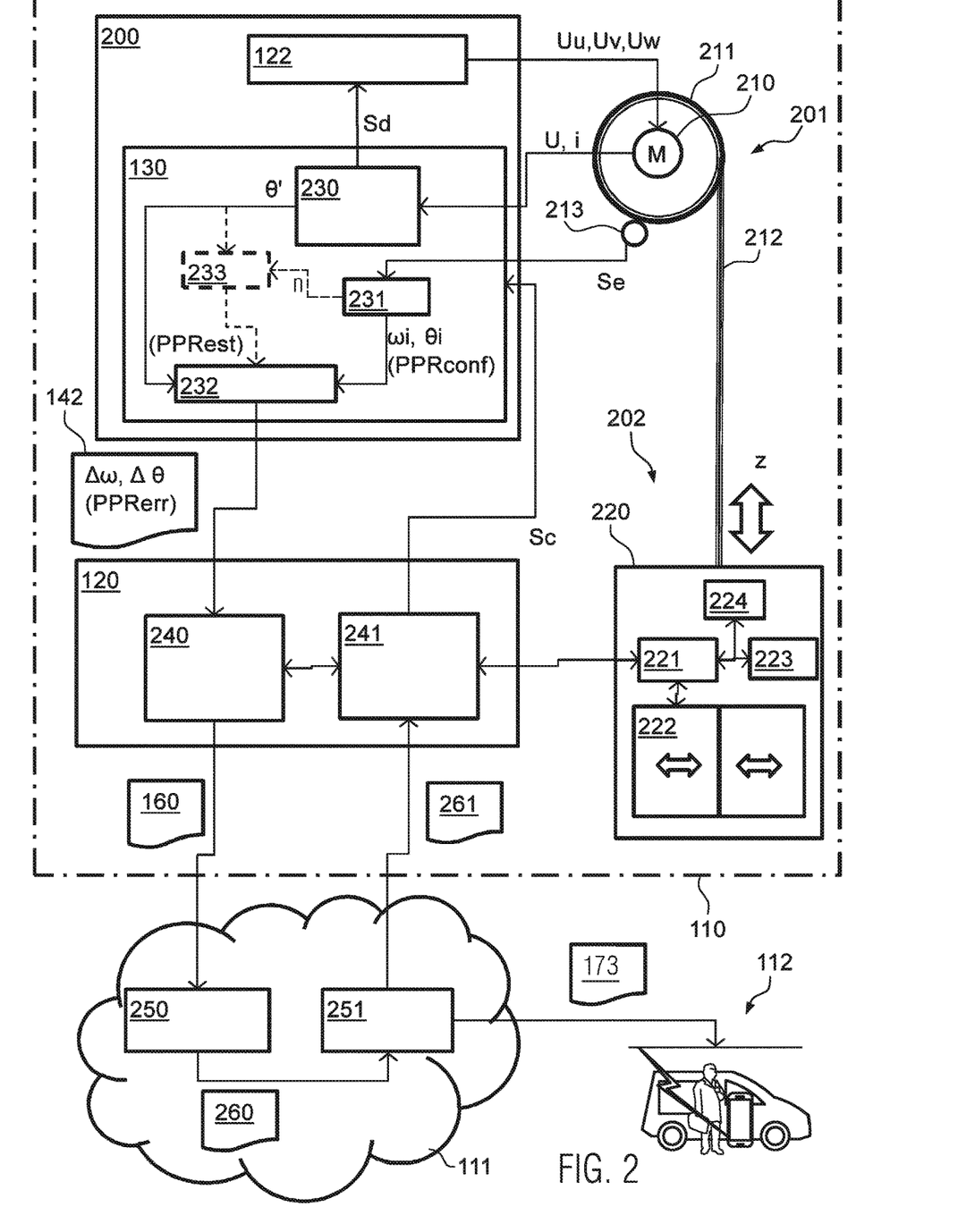
FIG. 2 is a schematic diagram of a maintenance system or method according to another exemplary embodiment of the invention.

FIG. 2 is a schematic diagram of a maintenance system or method according to another exemplary embodiment of the invention. However, it will be noted that the maintenance system or method of this exemplary embodiment is a variation of the maintenance system 100 or maintenance method 101 of the previous exemplary embodiment. In the following, only differences or special options of this exemplary embodiment with respect to the previous exemplary embodiment are described in full while other features may be taken from the above description of the previous exemplary embodiment. In particular, any features shown and described in the context of the previous exemplary embodiment apply to this exemplary embodiment, and features shown and described in the context of this exemplary embodiment may be included in the previous exemplary embodiment. As above, elements shown in FIG. 2 may be realized as physical instances of the maintenance system, or steps of the maintenance method, or both. In FIG. 2, any links and interfaces are omitted, for ease of illustration.

An elevator 110 has a local control unit 120, a motor drive unit 200, a hoisting unit 201, and a car unit 202. The motor drive unit 200 includes the drive control board 121 (of which only the drive control 130 is shown in FIG. 2) and the motor drive 122 of the previous exemplary embodiment shown in FIG. 1. The hoisting unit 201 includes an electric motor 210, a drive pulley 211, a cable 212, and an incremental encoder 213. The car unit 202 includes a car 220 which in turn includes a car door control board 221, doors 222, a user interface panel 223, and car periphery and monitoring 224, and which is movable within a hoistway along a vertical direction to assume a vertical position z.

In the hoisting unit 201, a main shaft of the electric motor 210 is connected with drive pulley or sheave 211 which hence rotate together with the electric motor 210. The cable 212 is wound on the drive pulley 211 and connected to the elevator car 220. A wheel of the incremental encoder 213 used as a sensor is frictionally engaged with a rim of the drive pulley 211. The incremental encoder 213 has a pulses-per-rotation design value PPRenc which is a number of pulses per one full $2\pi$ rotation of a measuring wheel axis of the incremental encoder 213. As a nominal transmission ratio (gear ratio?) r between the measuring wheel axis of the incremental encoder and a drive axis of the electric motor is known, a pulses-per-rotation configuration value PPRconf representing a number of pulses which should be provided by the incremental encoder per one rotation of the electric motor 210 in normal operation is also known by design/configuration, and can be acquired based on the relation:

$$PPRconf = r \times PPRenc \quad (1).$$

In the motor drive unit 200, the control unit 130 comprises a simulation model 230, a decoding 231 and a calculation 233. The simulation model 230 is adapted to provide a motor model, and to output a drive signal Sd to the motor drive 122. The motor drive 122, under control of the drive signal Sd, performs switching and the like to provide phase voltages Uu, Uv, Uw of the electric motor 210. The simulation model 230 also calculates and outputs an estimated pole position θ' of the motor 210. Motor current (stator current) i and motor voltage U are also measured and passed to simulation model 230.

The estimated pole position θ' is passed to correction 232. An encoder signal Se which the incremental encoder 213 outputs is passed to decoding 231 where motor pole position θi and motor speed ωi are calculated based on the encoder signal Se. Based on estimated pole position θ' and measured pole position θi and motor speed ωi, correction 232 calculates a position error Δθ and speed error Δω.

Alternatively or additionally, estimated pole position θ' and/or other model values such as estimated and/or measured stator current i and/or voltage U as available is/are passed from model 230 to calculation 233. Also an encoder pulse count n may be passed from decoding 231 to calculation 233. Calculation 233 is adapted to calculate a pulses-per-rotation estimation value PPRest representing a number of pulses per one rotation of the electric motor 210, based on motor model information of the electrical motor control 130 and encoder pulse count. Then, correction 232 may determine a pulses-per-rotation error value PPRerr representing a deviation of the pulses-per-rotation estimation value PPRest from the pulses-per-rotation configuration value PPRconf, based on the relation $$PPRerr = PPRest - PPRconf \text{ or } PPRconf - PPRest. \quad (2)$$

It will be noted that the above PPRerr is an absolute error value. There may also be defined a relative error PPRerr' which is defined by $$PPRerr' = PPRerr/PPRconf \text{ or } PPRconf/PPRest. \quad (3)$$

In particular, the deriving a pulses-per-rotation estimation value PPRest may be realized as follows. Stator current of a stator winding of said electric motor is measured, and a stator voltage of a stator winding of said electric motor is measured or estimated, based on said motor model as a reference of the motor voltage Uu, Uv, Uw. Then, a magnetic pole position of the magnetic pole of the rotor of said electric motor is estimated, based on said measured stator current and determined stator voltage. For this purpose the motor model also contains information about stator inductance and resistance. The motor may be a synchronous permanent magnet motor. Counting output pulses of the incremental encoder, to obtain an encoder pulse count, allows to determine a position error of a rotor of said electric motor, based on said estimated magnetic pole position and counted encoder pulses, correct said counted encoder pulses by means of said determined position error, to obtain a corrected encoder pulse count, and compare said corrected encoder pulse count with the pulses-per-rotation configuration value PPRconf so as to eventually obtain PPRest.

In this context, a method of determining a position error of the rotor of a synchronous machine, and deriving a corrected movement signal (encoder signal), as disclosed in WO 2009/144362 A1 by the same applicant can be utilized advantageously. According to FIG. 3 of this document disclosure of which is included by reference, in this regard, an encoder gives pulses which are counted with a counter 26. It is the raw pulse data which includes an error. To know PPRest, it has to be known counter 26 reading when the rotor has rotated one round. E.g. it is to be known exactly when to read counter 26. In this connection, there is a signal 25 which basically represents the same encoder signal but compensated with the position error 8. In FIG. 3, the encoder signal 3 as well as signal 25 are scaled but for ease of understanding it may be assumed that the scaling factor is 1 so that pulse counter 26 value can directly be handled. This means that in parameter 25 there is a pulse counter value but with a corrected pulse amount. Then the value PPRconf can be known which means how many pulses are outputted by the encoder (e.g. how much counter value 26 changes) when the rotor rotates one round and no error exists in the encoder signal. Now, if signal 25 is compared to the PPRconf value, it is known exactly when the rotor has rotated one round (e.g. when signal 25 has changed the amount of PPRconf). At this moment, it is possible to read the pulse counter 26 to get the PPRest, reset the reading and start again. (It is to be noted that reference numerals in the above paragraph refer to the aforementioned WO publication.)

In other words, a speed of elevator motor is controlled with frequency converter (motor drive 122). Rotating speed and motor pole position are measured with encoder 213. At the same time, frequency converter DSP processor (drive control 130) runs an internal simulation model 230 of motor pole position (see aforementioned WO publication, equation 1-4, in particular equation 3), using measured motor currents and voltages, and speed and position measurement are corrected with this simulation model.

As seen in FIG. 2 of the present application, local control unit 120 comprises a diagnostic framework 240 and a control board 241 which interact with each other. Diagnostic framework 240 can be assumed to include all the elements 152 to 157 as shown in FIG. 1. Control board 241 is designed to exchange signals with car control board 221 which in turn is designed to exchange signals with door sensors and/or motor drives of doors 222, user interface panel 223, and car periphery and monitoring 224. Based on signals from the car 220 and the motor drive unit, control board 241 controls car doors 222, car periphery such as lighting 223 as well as it provides control signals Sc for the motor drive control 130 so as to provide drive signals Sd for having the motor 210 move the cabin 220.

Error values Δθ, Δω and/or PPRerr may be understood to represent KPI samples (141 in FIG. 1) being generated in motor drive unit 200, limited to provide selected KPI samples 142 and passed to diagnostic framework 240 of local control unit 120 which in turn generates KPI daily statistics data 160 therefrom (condition files 132 as well as selected KPI files 143 as shown in FIG. 1 are omitted, for ease of illustration) and passes the same to remote monitoring unit 111.

Remote monitoring unit 111 is included in a cloud computing architecture, in this exemplary embodiment. Remote monitoring unit 111 comprises a data analysis platform 250 and a maintenance unit 251. Data analysis platform 250 and maintenance unit 251 may be assumed to include at least parts of diagnosis and prognosis section 172 as shown in FIG. 1. The KPI daily statistics data 160 are sent e.g. on a daily basis to data analysis platform 250 which in turn generates trend information 260. Trend information 260 may be generated such that a raising trend can be detected and a maintenance action can be triggered before failure of the encoder 213 takes place, which would prevent elevator operation. To this end, trend information 260 is sent to maintenance unit 251 for analyzation. If maintenance unit 251 detects that a maintenance action is needed, it generates either a maintenance instruction 261 and passes it to control board 241 of the local control unit 120 in case maintenance can be executed by useful control signaling to the drive control or others, or generates a service needs report 173 and passes it to service unit 112 as described above. In the present case, the service needs report may e.g. read something like "[Service needs report on elevator X1:]

Check car encoder attachment as there has been detected too big speed difference compared to motor speed. Related reports of <signals> available by selecting "Get reports".

In this manner, the pulses-per-rotation error value PPRerr is utilized for establishing a maintenance information indicating that a maintenance should be done on the transportation device (elevator) 110.

I.e., an amount of correction required to the encoder output is evaluated and sent to diagnostic framework 240 of local control unit 120, which calculates daily statistics 160 (minimum, maximum, mean value, standard deviation).

The calculated statistics data 160 is sent daily to data analytics platform 250 of the cloud computing system 111, to create and analyse time series (trends) 260 of the daily statistics data 160 such that a raising trend can be detected and a maintenance action can be triggered before failure of the encoder 213 takes place, that would prevent elevator operation.

In other words, the system has following parts: data source such as the frequency converter (motor drive) 122, diagnostic framework 240 in the local control unit 120 which is generally present to take care of receiving elevator calls, commanding elevator drive to drive elevator to certain floor and so on, a (remote) cloud computing system 111 with data analytics platform 250 and maintenance unit(s) 251, which react to the analysis results from the data analytics platform 250.

This application focuses on condition monitoring of the motor encoder 213. On the other hand, a similar monitoring system may be utilized for analysis of other data also.

Even if the invention was described above based on elevators, as a matter of example, the invention is applicable to any transportation system using an electric motor for moving a moving part of the transportation system. The moving part may be a cabin of an elevator, a car of a roller coaster, a moving stairway or walkway, a locomotive of a railway, or others.

It is to be noted that the monitoring interval may be other than daily, i.e., may be shorter such as twice daily, hourly, or less such as even after every run, or may be longer such as twice weekly, weekly, monthly, or more.

A technical feature or several technical features which has/have been disclosed with respect to a single or several embodiments discussed herein before, e. g. the service car 190 in FIG. 1 may be present also in another embodiment e. g. the maintenance system shown in FIG. 2 except it is/they are specified not to be present or it is impossible for it/them to be present for technical reasons.

LIST OF REFERENCE SIGNS

100 Maintenance system
101 Maintenance method
110 Transportation device (e.g., elevator)
111 Remote monitoring unit (cloud computing system)
112 Service unit
113 Device link
114 Service link
120 Local control unit
121 Drive control board
122 Motor drive (frequency converter)
123 Control link
124 Drive link
130 Drive control (Existing MCU & DSP algorithms)
132 KPI generation
133 CF generation
134 KPI sample limitation
135 Uplink interface
140 Raw data
141 Key performance indicator (KPI)
142 KPI sample
143 Condition file (CF)
150 Downlink interface
151 Uplink interface
152 KPI database
153 CF buffering
154 KPI sample buffering
155 KPI daily statistics calculation
156 KPI daily statistics buffering
157 CF generation
160 KPI daily statistics file
161 KPI daily statistics stack
163 KPI sample stack
164 CF stack
170 Downlink interface
172 Diagnosis & prognosis section
173 Service needs report
180 Device images
181 Events & statistics history
182 KPI history
183 KPI statistics history
184 Raw data history
190 Service car
191 Serviceman
192 Communication device
200 Motor drive unit
201 Hoisting unit
202 Car unit
210 Electric motor
211 Drive pulley
212 Cable
213 Incremental encoder
220 Car
221 Car control board
222 Doors (door drive(s), door sensor(s))
223 User interface panel
224 Car periphery and monitoring
230 Simulation model
231 Decoding
232 Correction
233 Calculation
240 Diagnostic framework
241 Control board
250 Data analysis platform
251 Maintenance unit
260 Trend information
261 Maintenance instruction
i Motor current
n Encoder pulse count
z Car position PPRconf Pulses-per-rotation of motor according to configuration
PPRenc Pulses-per-rotation of encoder wheel by design
PPRerr Pulses-per-rotation error, absolute
PPRerr' Pulses-per-rotation error, relative
PPRest Pulses-per-rotation of motor estimated according to motor simulation
Sc Control signal
Sd Drive signal
Se Encoder signal
U Motor voltage
Uu,Uv,Uw Phase voltages
X1,X2, . . . ,Xn Elevators (transportation devices)
$\Delta\theta$ Rotor position error
$\Delta\omega$ Rotor angular speed error
$\theta i$ Rotor position, measured
$\theta'$ Rotor position, estimated according to motor simulation
$\omega i$ Rotor angular speed, measured The above list is an integral part of the description.

The invention claimed is:

1. A method for operation of a maintenance system that includes an electric motor, a transportation device propelled by the electric motor, and an incremental encoder configured to sense motion of a moving part of the electric motor or a part moved by the electric motor, the electric motor configured to be controlled according to a motor model, the method comprising:

acquiring a pulses-per-rotation configuration value (PPRconf), the pulses-per-rotation configuration value PPRconf being a drive parameter of the incremental encoder and representing a nominal/configured quantity of pulses which should be provided by the incremental encoder per one rotation of the electric motor when the incremental encoder is operating according to normal operation;

deriving a pulses-per-rotation estimation value (PPRest), the pulses-per-rotation estimation value PPRest representing an estimated quantity of pulses actually provided by the incremental encoder per one rotation of the electric motor, based on estimating speed and position of the electric motor independently of an encoder signal proved by the incremental encoder, based on the motor model used to control the electric motor;

determining a pulses-per-rotation error value (PPRerr), the pulses-per-rotation error value PPRerr representing a deviation of the pulses-per-rotation estimation value PPRest from the pulses-per-rotation configuration value PPRconf, based on a relation that is one of PPRerr=PPRest−PPRconf, PPRerr=PPRconf−PPRest, PPRerr=PPRest/PPRconf, or PPRerr=PPRconf/PPRest;

utilizing the pulses-per-rotation error value PPRerr to generate an instance of maintenance information indicating that a maintenance operation should be performed on the transportation device, and transmitting the instance of maintenance information as a message to a remote device, the message including a request to preform the maintenance operation, or a control signal to a control device to cause the control device to preform the maintenance operation based on controlling the transportation device and/or the electric motor.

2. The method of claim 1, wherein
the pulses-per-rotation configuration value PPRconf is acquired based on a separate relation including a pulses-per-rotation of encoder wheel by design value (PPRenc) that is a quantity of pulses per one rotation of a measuring wheel axis of the incremental encoder, and a nominal transmission ration (r) between the measuring wheel axis of the incremental encoder and drive axis of the electric motor, and
the relation is PRRconf=r×PPRenc.

3. The method of claim 1, wherein the deriving the pulses-per-rotation estimation value PPRest includes
determining a stator current of a stator winding of the electric motor;
determining a stator voltage of the stator winding of the electric motor;
determining a magnetic pole position of a magnetic pole of a rotor of the electric motor, based on the stator current and the stator voltage;
counting output pulses of the incremental encoder to obtain an encoder pulse count;
determining a position error of the rotor of said electric motor, based on the determined magnetic pole position and the counted encoder pulses;
correcting the counted encoder pulses based on the determined position error to obtain a corrected encoder pulse count; and
comparing the corrected encoder pulse count with the pulses-per-rotation configuration value PPRconf to determine the pulses-per-rotation estimation value PPRest.

4. The method of claim 1, wherein the acquiring, the deriving, and the determining are each executed subsequent to completion of a travelling event associated with the transportation device.

5. The method of claim 1, wherein the generating the instance of maintenance information includes
collecting a plurality of pulses-per-rotation error values PPRerr in response to separate, respective one or more determination of the pulses-per-rotation error value PPRerr;
computing error statistics over a particular time interval based on the collected plurality of pulses-per-rotation error values PPRerr;
evaluating trend information based on the computed error statistics over a plurality of particular time intervals; and
generating the instance of maintenance information in response to a determination that the evaluated trend information meets a particular maintenance criterion.

6. The method of claim 5, wherein the particular maintenance criterion is associated with advance indication of a failure or problem associated with the maintenance system, such that the evaluated trend information meets the particular maintenance criterion prior to occurrence of the failure or problem.

7. The method of claim 5, wherein
the particular maintenance criterion is associated with a particular type of failure or problem associated with the maintenance system, and
the instance of maintenance information indicates the particular type of failure or problem.

8. The method of claim 5, wherein the evaluating and the generating are both executed at a remote monitoring unit or a data analysis platform.

9. The method of claim 5, wherein the collecting and the computing are both executed at a local control unit of the transportation device.

10. The method of claim 1, wherein the instance of maintenance information is transferred or made accessible to a remote maintenance center, a mobile service unit, or a local control unit of an elevator system, depending on a type of failure or problem indicated by the instance of maintenance information.

11. The method of claim 1, wherein
the electric motor is a permanent magnet synchronous motor with a plurality of phases,
the electric motor is configured to be controlled by a frequency converter, and
the motor model provides two-component reference values for stator voltages and/or stator currents of the electric motor.

12. The method of claim 1, wherein
the transportation device is selected from one of
an elevator,
an escalator,
a moving walkway,
a cable car,
a railway locomotive,
a railcar,
a roller coaster,
a conveyor,
a crane,
a positioning unit, and
a combination thereof.

13. A non-transitory data carrier carrying data representing a software program that, when executed on a computer, realizes the method according to claim 1.

14. The non-transitory data carrier of claim 13, wherein the computer is a distributed computing system part of a cloud computing system.

15. A controller configured to control a transportation device, the transportation device configured to be propelled by an electric motor, the controller comprising:
a non-transitory data carrier carrying data representing a software program; and
a computer configured to execute the software program to
receive an output of an incremental encoder, the incremental encoder configured to sense motion of a moving part of the electric motor or a part configured to be moved by the electric motor;
calculate a motor model associated with control of the electric motor;
acquire a pulses-per-rotation configuration value (PPRconf), the pulses-per-rotation configuration value PPRconf being a drive parameter of the incremental encoder and representing a nominal/configured quantity of pulses which should be provided by the incremental encoder per one rotation of the electric motor when the incremental encoder is operating according to normal operation;
derive a pulses-per-rotation estimation value (PPRest), the pulses-per-rotation estimation value PPRest representing an estimated quantity of pulses actually provided by the incremental encoder per one rotation of the electric motor, based on estimating speed and position of the electric motor independently of an encoder signal provided by the incremental encoder, based on the motor model used to control the electric motor;
determine a pulses-per-rotation error value (PPRerr), the pulses-per-rotation error value PPRerr representing a deviation of the pulses-per-rotation estimation value PPRest from the pulses-per-rotation configuration value PPRconf, based on a relation that is one of $$PPRerr = PPRest - PPRconf,$$

$$PPRerr = PPRconf - PPRest,$$

$$PPRerr = PPRest/PPRconf, \text{ or}$$

$$PPRerr = PPRconf/PPRest;$$

utilize the pulses-per-rotation error value PPRerr to generate an instance of maintenance information indicating that a maintenance operation should be performed on the transportation device; and
transmit the instance of maintenance information as
a message to a remote device via a device link, the message including a request to perform the maintenance operation, or
a control signal to a control device to cause the control device to perform the maintenance operation based on controlling the transportation device and/or the electric motor.

16. The controller of claim 15, wherein
the computer is configured to execute the software program to acquire the pulses-per-rotation configuration value PPRconf based on a separate relation including a pulses-per-rotation of encoder wheel by design value (PPRenc) that is a quantity of pulses per one rotation of the measuring wheel axis of the incremental encoder, and a nominal transmission ratio (r) between the measuring wheel axis of the incremental encoder and a drive axis of the electric motor, and
the relation is $PRRconf = r \times PPRenc$.

17. The controller of claim 15, wherein the computer is configured to execute the software program to
determine a stator current of a stator winding of the electric motor;
determine a stator voltage of the stator winding of the electric motor;
determine a magnetic pole position of a magnetic pole of a rotor of the electric motor, based on the stator current and the stator voltage;
count output pulses of the incremental encoder to obtain an encoder pulse count;
determine a position error of the rotor of said electric motor, based on the determined magnetic pole position and the counted encoder pulses;
correct the counted encoder pulses based on the determined position error to obtain a corrected encoder pulse count; and
compare the corrected encoder pulse count with the pulses-per-rotation configuration value PPRconf to determine the pulses-per-rotation estimation value PPRest.

18. The controller of claim 15, wherein the computer is configured to execute the software program to execute each of the acquiring, the deriving, and the determining subsequent to completion of a travelling event associated with the transportation device.

19. The controller of claim 15, wherein the computer is configured to execute the software program to
collect a plurality of pulses-per-rotation error values PPRerr in response to separate, respective one or more determination of the pulses-per-rotation error value PPRerr;

compute error statistics over a particular time interval based on the collected plurality of pulses-per-rotation error values PPRerr;

evaluate trend information based on the computed error statistics over a plurality of particular time intervals; and generate the instance of maintenance information in response to a determination that the evaluated trend information meets a particular maintenance criterion.

20. The controller of claim 19, wherein the particular maintenance criterion is associated with advance indication of a failure or problem associated with a maintenance system, such that the evaluated trend information meets the particular maintenance criterion prior to occurrence of the failure or problem.

* * * * *